(12) United States Patent
Sterzel

(10) Patent No.: US 7,847,187 B2
(45) Date of Patent: Dec. 7, 2010

(54) PHOTOVOLTAIC CELL COMPRISING A PHOTOVOLTAICALLY ACTIVE SEMICONDUCTOR MATERIAL COMPRISING A PARTICULAR PORTION OF TELLURIUM IONS REPLACED WITH HALOGEN AND NITROGEN IONS

(75) Inventor: Hans-Josef Sterzel, Dannstadt-Schauernheim (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 462 days.

(21) Appl. No.: 11/718,039

(22) PCT Filed: Oct. 26, 2005

(86) PCT No.: PCT/EP2005/011461

§ 371 (c)(1),
(2), (4) Date: Jan. 18, 2008

(87) PCT Pub. No.: WO2006/045600

PCT Pub. Date: May 4, 2006

(65) Prior Publication Data

US 2009/0133745 A1 May 28, 2009

(30) Foreign Application Priority Data

Oct. 26, 2004 (DE) ........................ 10 2004 052 012

(51) Int. Cl.
*H01L 31/00* (2006.01)
*C23C 14/00* (2006.01)
*C23C 14/32* (2006.01)
*H01L 21/00* (2006.01)
*B05D 5/12* (2006.01)

(52) U.S. Cl. .................. 136/264; 136/256; 136/252; 136/265; 204/192.25; 204/192.26; 438/84; 438/95; 427/76

(58) Field of Classification Search ......... 136/243–265; 438/57–98; 204/192.25, 192.26; 205/176, 205/184, 187, 191
See application file for complete search history.

(56) References Cited

U.S. PATENT DOCUMENTS 6,306,739 B1 * 10/2001 Alexander .................. 438/584
6,548,751 B2 * 4/2003 Sverdrup et al. ............. 136/260
2003/0051752 A1 3/2003 Sterzel et al.

FOREIGN PATENT DOCUMENTS

DE 102 23 744 12/2003
EP 0 708 488 4/1996
EP 1 388 597 2/2004

OTHER PUBLICATIONS

Yu et al. "Formation of diluted III-V nitride thin films by N ion implantation". Journal of Applied Physics; vol. 90, No. 5; pp. 2227-2234; Sep. 1, 2001.*

Yu et al. "Diluted II-VI Oxide Semiconductors with Multiple Band Gaps". Physical review letters; vol. 91, No. 24; Dec. 12, 2003.*

Antonio Luque, et al.; "Increasing the Efficiency of Ideal Solar Cells by Photon Induced Transitions at Intermediate Levels"; vol. 78; No. 26; Physical Review Letters; pp. 5014-5017; Jun. 30, 1997.

K. M. Yu, et al.; "Band Anticrossing in Group II-$O_x$-$VI_{1-x}$ Highly Mismatched Alloys: $Cd_{1-x}Mn_yO_xTe_{1-x}$ Quaternaries Synthesized by O Ion Implantation"; Applied Physics Letters; vol. 80, No. 9; pp. 1571-1573; Mar. 4, 2002.

K. M. Yu, et al.; "Synthesis and Optical Properties of II-O-Vi Highly Mismatched Alloys"; Journal of applied physics; vol. 95; No. 11; pp. 6232-6238; Jun. 1, 2004.

X. Liu, et al.; "Optical Properties of Epitaxial ZnMnTe and ZnMgTe Films for a Wide Range of Alloy Compositions"; Journal of Applied Physics; vol. 91, No. 5; pp. 2859-2865; Mar. 1, 2002.

H-C Mertins, et al.; "Bandgap of $Zn_{1-x}Mn_x$Te:Nonlinear Dependence on Composition and Temperature"; Semicond. Sci. Technol.; 8 (1993); 1634-1638.

Le. Van Khoi, et al.; "Electrical and Magnetic Properties of Phosphorus Doped Bulk $Zn_{1-x}Mn_x$Te"; Moldavian Journal of the Physical Sciences; No. 1; pp. 11-14; 2002.

J. H. Chang, et al.; "Aluminum-Doped n-Type Zn Te Layers Grown by Molecular-Beam Epitaxy" Applied Physics Letters; vol. 79; No. 6; pp. 785-787; Aug. 6, 2001.

Syed Irfan Gheyas, et al.; "Aluminum Doping of ZnTe Grown by MOVPE"; Applied Surface Science 100/101 (1996)634-638.

(Continued)

*Primary Examiner*—Jeffrey T Barton
*Assistant Examiner*—Christina Chern
(74) *Attorney, Agent, or Firm*—Oblon, Spivak, McClelland, Maier & Neustadt, L.L.P.

(57) ABSTRACT

The invention relates to a photovoltaic cell comprising a photovoltaically active semiconductor material, wherein the photovoltaically active semiconductor material is a p- or n-doped semiconductor material comprising a binary compound of the formula (I) or a ternary compound of the formula (II):

$$ZnTe \qquad (I)$$

$$Zn_{1-x}Mn_xTe \qquad (II)$$

where x is from 0.01 to 0.99, and a particular proportion of tellurium ions in the photovoltaically active semiconductor material has been replaced by halogen ions and nitrogen ions and the halogen ions are selected from the group consisting of fluoride, chloride and bromide and mixtures thereof.

12 Claims, No Drawings

OTHER PUBLICATIONS

Gilbert J. Perlow, et al.; "Journal of Applied Physics" vol. 43; Jan.-Dec. 1972.

I. W. Tao, et al.; "Doping of ZnTe by Molecular Beam Epitaxy" Appl. Phys. Lett. 64 (14); Apr. 4, 1994.

T. Trupke, et al. "Improving Solar Cell Efficiencies by the Up-Conversion of Sub-Band-Gap Light" Centre for Third Generation Photovoltaics, University of New South Wales, NSW 2052, Australia, Mar. 2002.

* cited by examiner

PHOTOVOLTAIC CELL COMPRISING A PHOTOVOLTAICALLY ACTIVE SEMICONDUCTOR MATERIAL COMPRISING A PARTICULAR PORTION OF TELLURIUM IONS REPLACED WITH HALOGEN AND NITROGEN IONS

The invention relates to photovoltaic cells and the photovoltaically active semiconductor material present therein.

Photovoltaically active materials are semiconductors which convert light into electric energy. The principles of this have been known for a long time and are utilized industrially. Most of the solar cells used industrially are based on crystalline silicon (single-crystal or polycrystalline). In a boundary layer between p and n-conducting silicon, incident photons excite electrons of the semiconductor so that they are raised from the valence band to the conduction band.

The magnitude of the energy gap between the valence band and the conduction band limits the maximum possible efficiency of the solar cell. In the case of silicon, this is about 30% on irradiation with sunlight. In contrast, an efficiency of about 15% is achieved in practice because some of the charge carriers recombine by various processes and are thus no longer effective.

DE 102 23 744 A1 discloses alternative photovoltaically active materials and photovoltaic cells in which these are present, which have the loss mechanisms which reduce efficiency to a lesser extent.

With an energy gap of about 1.1 eV, silicon has quite a good value for practical use. A decrease in the energy gap will push more charge carriers into the conduction band, but the cell voltage becomes lower. Analogously, larger energy gaps would result in higher cell voltages, but because fewer photons are available to be excited, lower usable currents are produced.

Many arrangements such as series arrangement of semiconductors having different energy gaps in tandem cells have been proposed in order to achieve higher efficiencies. However, these are very difficult to realize economically because of their complicated structure.

A new concept comprises generating an intermediate level within the energy gap (up-conversion). This concept is described, for example, in Proceedings of the 14$^{th}$ Workshop on Quantum Solar Energy Conversion-Quantasol 2002, Mar. 17-23, 2002, Rauris, Salzburg, Austria. "Improving solar cells efficiencies by the up-con version", Tl. Trupke, M. A. Green, P. Würfel or "Increasing the Efficiency of Ideal Solar Cells by Photon Induced Transitions at intermediate Levels", A. Luque and A. Marti, Phys. Rev. Letters, Vol. 78, No. 26, June 1997, 5014-5017. In the case of a band gap of 1.995 eV and an energy of the intermediate level of 0.713 eV, the maximum efficiency is calculated to be 63.17%.

Such intermediate levels have been confirmed spectroscopically, for example in the system $Cd_{1-y}Mn_yO_xTe_{1-x}$ or $Zn_{1-x}Mn_xO_yTe_{1-y}$. This is described in "Band anticrossing in group II-$O_xVI_{1-x}$ highly mismatched alloys: $Cd_{1-y}Mn_yO_xTe_{1-x}$ quaternaries synthesized by O ion implantation", W. Walukiewicz et al., Appl. Phys. Letters, Vol 80, No. 9, March 2002, 1571-1573, and in "Synthesis and optical properties of II-O-VI highly mismatched alloys", W. Walukiewicz et ah, Appl. Phys. Vol 95, No. 11, June 2004, 6232-6238. According to these authors, the desired intermediate energy level in the band gap is raised by part of the tellurium anions in the anion lattice being replaced by the significantly more electronegative oxygen ion. Here, tellurium was replaced by oxygen by means of ion implantation in thin films. A significant disadvantage of this class of materials is that the solubility of oxygen in the semiconductor is extremely low. This results in, for example, the compounds $Zn_{1-x}Mn_xTe_{1-y}O_y$, in which, y is greater than 0.001 being thermodynamically unstable. On irradiation over a prolonged period, they decompose into the stable tellurides and oxides, Replacement of up to 10 atom % of tellurium by oxygen would be desirable, but such compounds are not stable.

Zinc telluride, which has a direct band gap of 2.32 eV at room temperature, would be an ideal semiconductor for the intermediate level technology because of this large band gap. Zinc in zinc telluride can readily be replaced continuously by manganese, with the band gap increasing to about 2.8 eV for MnTe ("Optical Properties of epitaxial ZnMnTe and ZnMgTe films for a wide range of alloy compositions", X. Liu et ah, J. Appl. Phys. Vol. 91, No. 5, March 2002, 2859-2865; "Bandgap of $Zn_{1-x}Mn_xTe$: non linear dependence on composition and temperature", H. C.Mertins et ah. Semicond. Sci. Technol. 8 (1993) 1634-1638).

$Zn_{1-x}Mn_xTe$ can be doped with up to 0.2 mol % of phosphorus to make it p-conductive, with an electrical conductivity in the range from 10 to 30 $\Omega^{-1}$ cm$^{-1}$ ("Electrical and Magnetic Properties of Phosphorus Doped Bulk $Zn_{1-x}Mn_xTe$", Le Van Khoi et al., Moldavian Journal of Physical Sciences, No. 1, 2002, 11-14). Partial replacement of zinc by aluminum gives n-conductive species ("Aluminium-doped n-type ZnTe layers grown by molecular-beam epitaxy", J. H. Chang et al. Appl. Phys. Letters, Vol 79, No. 6, August 2001, 785-787; "Aluminium doping of ZnTe grown by MOPVE", S. I. Gheyas et al., Appl. Surface Science 100/101 (1996) 634-638; "Electrical Transport and Photoelectronic Properties of ZnTe:Al Crystals", T. L. Lavsen et al., J. Appl. Phys., Vol 43, No. 1, January 1972, 172-182). At degrees of doping of about 4*10$^{18}$ Al/cm$^3$, electrical conductivities of from about 50 to 60 $\Omega^{-1}$ cm$^{-1}$ can be achieved.

It is an object of the present invention to provide a photovoltaic cell which has a high efficiency and a high electric power and avoids the disadvantages of the prior art. A further object of the present invention is to provide, in particular, a photovoltaic cell comprising a thermodynamically stable photovoltaically active semiconductor material which has an intermediate level in the energy gap.

This object is achieved according to the invention by a photovoltaic cell comprising a photovoltaically active semiconductor material, wherein the photovoltaically active semiconductor material is a p- or n-doped semiconductor material comprising a binary compound of the formula (I) or a ternary compound of the formula (II):

ZnTe                                                (I)

$Zn_{1-x}Mn_xTe$                             (II)

where x is from 0.01 to 0.99, and a particular proportion of tellurium ions in the photovoltaically active semiconductor material has been replaced by halogen ions and nitrogen ions and the halogen ions are selected from the group consisting of fluoride, chloride and bromide and mixtures thereof.

In ZnTe or $Zn_{1-x}Mn_xTe$, the tellurium ion cannot easily be replaced by a halogen ion. Halogen ions bear a single negative charge. A doubly negatively charged tellurium ion would therefore have to be replaced by two halide ions, which is not possible at high doping concentrations. For this reason, the solution provided by the invention comprises replacing tellurium ions by halogen ions and triply negatively charged nitrogen ions. With a radius of 1.71 Å of $N^{3-}$, $Te^{2-}$ can be replaced by $N^{3-}$, with the difference in the electronegativity relative to $Te^{2-}$ being 0.94. The molar ratio of halogens and nitrogen can be 1:1. Surprisingly, other molar ratios of halogens to nitrogen are also possible.

Manganese-containing alloys easily intercalate nitrogen as $N^{3-}$, so that the solution provided by the invention relates, inter alia, to tertiary semiconductors of the formula $Zn_{1-x}Mn_xTe$ with $x= 0.01$ to $0.09$.

The photovoltaic cell of the invention has the advantage that the photovoltaically active semiconductor material used is thermodynamically stable even after replacement of tellurium by halogen and nitrogen (surprisingly not only in a molar ratio of halogen to nitrogen of 1:1). Furthermore, the photovoltaic cell of the invention has a high efficiency (up to >20%), since the replacement of tellurium ions by halogen ions and nitrogen ions produces an intermediate level in the energy gap of the photovoltaically active semiconductor material. Without an intermediate level, only photons having at least the energy of the energy gap could raise electrons or charge carriers from the valence band into the conduction band. Photons having a higher energy also contribute to the efficiency, with the excess energy compared to the band gap being lost as heat. In the case of the intermediate level which is present in the semiconductor material used according to the present invention and can be partly occupied, more photons can contribute to excitation.

The photovoltaic cell of the invention comprises a p doped semiconductor material and an n-doped semiconductor material, with these two semiconductor materials being adjoined so as to form a p-n transition. Both the p-doped semiconductor material and the n-doped semiconductor material comprise substantially the binary compound of the formula (I) or a ternary compound of the formula (II), with some of the tellurium ions having been replaced by halogen ions and nitrogen ions and the material additionally being doped with donor ions in the p-doped semiconductor material and acceptor ions in the n-doped semiconductor material. Here, the p-doped semiconductor material can contain halogen ions or halogen ion mixtures different from those in the n-doped semiconductor material.

According to the present invention, the photovoltaically active semiconductor material contains fluoride, chloride or bromide or a mixture thereof as halogen ions. Thus, the tellurium ions in the semiconductor material comprising the binary compound of the formula (I) or a ternary compound of the formula (II) are partly replaced by fluorine, chlorine or bromine ions and nitrogen ions. These three types of halogen ions have an ionic radius which is advantageous for the replacement. Tellurium ions have an ionic radius of 2.11 Å, fluoride ions have a radius of 1.33 Å, chloride ions have a radius of 1.81 Å and bromide ions have a radius of 1.96 Å. The difference in the Pauling electronegativity relative to the electronegativity of tellurium (2.1) is 1.88 in the case of fluoride ions, 1.06 in the case of chloride ions and 0.86 in the case of bromide ions.

In a preferred embodiment of the present invention, nitrogen and halogens are each present in the photovoltaically active semiconductor material in an atomic concentration of from 0.1 atom % to 20 atom %, preferably from 0.2 atom % to 10 atom %. At this atomic concentration of nitrogen and a halogen or a mixture of halogens, an intermediate level is advantageously present in the energy gap of the photovoltaically active semiconductor material and makes an increase in the efficiency of the photovoltaic cell of the invention possible.

The p-doped semiconductor material preferably contains at least one element from the group consisting of As and P at an atomic concentration of up to 0.5 atom % and the n-doped semiconductor material preferably contains at least one element from the group consisting of Al, In and Ga at an atomic concentration of up to 0.5 atom %. Preferred doping elements are aluminum and phosphorus.

In a preferred embodiment of the photovoltaic cell of the invention, it comprises an electrically conductive substrate, a p layer of the p-doped semiconductor material having a thickness of from 0.1 to 10 µm, preferably from 0.3 to 3 µm, and an n layer of the n-doped semiconductor material having a thickness of from 0.1 to 10 µm, preferably from 0.3 to 3 µm. The substrate is preferably a flexible metal foil or a flexible metal sheet. The combination of a flexible substrate with thin photovoltaically active layers gives the advantage that no complicated and thus expensive support has to be used for holding the solar module comprising the photovoltaic cells of the invention. In the case of nonflexible substrates such as glass or silicon, wind forces have to be dissipated by means of complicated support constructions in order to avoid breakage of the solar module. On the other hand, if deformation due to flexibility is possible, very simple and inexpensive support constructions which do not have to be rigid under deformation forces can be used. In particular, a stainless steel sheet is used as preferred flexible substrate for the purposes of the present invention.

In a preferred embodiment of the present invention, the n-doped semiconductor material present in the n layer has a composition corresponding to (III) or (IV):

$$ZnTe_{1-2y}Hal_yN_y \qquad (III)$$

$$Zn_{1-x}Mn_xTe_{1-2y}Hal_yN_y \qquad (IV)$$

where $x= 0.01$ to $0.99$, $y= 0.01$ to $0.2$ and, is doped with phosphorus, arsenic or a mixture thereof and the p-doped semiconductor material present in the p layer has a composition corresponding to the formula (V) or (VI):

$$ZnTe_{1-2y}Hal_yN_y \qquad (V)$$

$$Zn_{1-x}Mn_xTe_{1-2y}Hal_yN_y \qquad (VI)$$

where $x= 0.01$ to $0.99$, $y= 0.01$ to $0.2$ and, is doped with aluminum, indium, gallium or a mixture thereof.

The invention further provides a process for producing a photovoltaic cell according to the invention, which comprises coating an electrically conductive substrate with at least two layers of the p- or n-doped semiconductor material comprising the compound of the formula (I) or (II), with each layer having a thickness of from 0.1 to 10 µm, preferably from 0.3 to 3 µm. Thus, at least one thin layer of each of the p- and n-doped semiconductor materials is produced on the electrically conductive substrate according to the invention.

Coating of the substrate with the p or n layer preferably comprises at least one deposition process selected from the group consisting of sputtering, electrochemical deposition or electroless deposition. The previously p- or n-doped semiconductor material comprising the binary compound of the formula (I) or the ternary compound of the formula (II) can be applied as a layer to the substrate by means of the respective deposition process. As an alternative thereto, a layer of the semiconductor material without p- or n-doping can firstly be produced by means of the deposition process and this layer can subsequently be p- or n-doped. The partial replacement according to the invention of tellurium ions by halogen ions and nitrogen ions in the semiconductor material (if the respective layer produced by one of the abovementioned deposition processes does not yet have the appropriate structure) is preferably carried out subsequent to the deposition process (and, if appropriate, to the p- or n-doping).

One possible deposition process is coating by sputtering. The term sputtering refers to the ejection of atoms from a sputtering target serving as electrode by means of accelerated ions and deposition of the ejected material on a substrate. To coat a substrate according to the present invention, sputtering targets of $Zn_{1-x}Mn_xTe:Al$ and $Zn_{1-x}Mn_xTe:P$, for example, are used for sputtering or the individual constituents of the semiconductor material are sputtered onto the substrate in succession and subsequently heated to a temperature of from 400 to 900° C.

When a sputtering target having, for example, the composition $Zn_{1-x}Mn_xTe:Al$ or $Zn_{1-x}Mn_xTe:P$ is produced by melting together the constituents, a ready-doped semiconductor layer is produced in the sputtering process. The elements after the colon are the doping elements. The layer produced in this way is subsequently doped with halogen(s) and nitrogen.

It is also possible to apply the constituents Zn, Mn, Te and Al or P to the substrate in succession by sputtering and then to heat the layers produced in this way to temperatures of from 400 to 900° C. so as to produce a thermodynamically stable composition. This is formed from the individual components by a solid-state reaction on the substrate.

Furthermore, a sputtering target having the composition ZnTe or $Zn_{1-x}Mn_xTe$ can be used or the constituents Zn, Te and, if appropriate, Mn can be applied in succession to the substrate by sputtering to form a layer. In these cases, both the p- or n-doping and the introduction of halogen and nitrogen are carried out in a separate production step for the photovoltaic cell of the invention.

A further preferred embodiment of a deposition process which can be used according to the invention is electrochemical deposition of, for example, $Zn_{1-x}Mn_xTe$ on the electrically conductive substrate. The electrochemical deposition of ZnTe is described in "Thin films of ZnTe electrodeposited on stainless steel", A. E. Rakhsan and B. Pradup. Appl. Phys. A (2003), Pub online Dec. 19, 2003, Springer-Verlag; "Electrodeposition of ZnTe for photovoltaic alls", R. Bozzini et ah, Thin Solid Films, 361-362, (2000) 288-295; "Electrochemical deposition of ZnTe Thin films", T. Mahalingam et al., Semicond. Sci. Technol. 17 (2002) 469-470; "Electrodeposition of Zn—Te Semiconductor Film from Acidic Aqueous Solution", R. Ichino et al., Second Internal. Conference on Processing Materials for Properties, The Minerals, Metals & Materials Society, 2000, and in U.S. Pat. No. 4,950,615, but not the electrochemical deposition of mixed Zn/Mn/Te layers.

A process according to the invention can also comprise electroless deposition of $Zn_{1-x}Mn_xTe$ layers by crosslinking an aqueous solution comprising $Zn^{2+}$, $Mn^{2+}$ and $TeO_3^{2-}$ ions by means of hypophosphorous acid ($H_3PO_2$) as reducing agent at temperatures of from 30 to 90° C. in the presence of the substrate. The hypophosphorous acid reduces $TeO_3^{2-}$ to $Te^{2-}$. Deposition on electrically nonconductive substrates is also made possible in this way.

Depending on the deposition process, after-treatments to incorporate halides and nitrogen into the layers and sometimes also to introduce the dopants may be necessary.

In a preferred embodiment of the present invention, the process of the invention comprises the following process steps:

a) coating of the electrically conductive substrate with a first layer of ZnTe or $Zn_{1-x}Mn_xTe$,
b) doping of the first layer with halogen ions and nitrogen ions,
c) establishment of p- or n-doping by doping with donor atoms or acceptor atoms,
d) coating of the first layer with a second layer of ZnTe or $Zn_{1-x}Mn_xTe$,
e) doping of the second layer with halogen ions and nitrogen ions,
f) establishment of n- or p-doping by doping with acceptor atoms or donor atoms and
g) application of an electrically conductive transparent layer and a protective layer to the second layer.

In step a), the electrically conductive substrate is coated with a first layer of ZnTe or $Zn_{1-x}Mn_xTe$ by, for example, sputtering, electrochemical deposition or electroless deposition. The substrate is preferably a metal sheet or a metal foil.

This first layer is then doped with halogen and nitrogen in step b). This can be effected by, for example, treatment of the layer with ammonium halide in the temperature range from 500 to 1200° C. under nitrogen or argon. At these temperatures, ammonium halide is gaseous and is partly dissociated into the nitriding $NH_3$ and the halogenating HCl.

In step c), the establishment of p- or n-doping is subsequently effected by doping with donor atoms or acceptor atoms. For example, the first layer is doped either with phosphorus (for example from $PCl_3$) to form a p conductor or with aluminum (for example from $AlCl_3$) to form an n conductor.

In step d), the second layer of ZnTe or $Zn_{1-x}Mn_xTe$ is then deposited on the first layer. For this purpose, it is possible, for example, to employ the same deposition process as in step a).

In step e), nitrogen and halogen are introduced into the second layer as described for the first layer in step b).

The doping established in step f) is opposite to the doping established in step c), so that one layer is p-doped and the other layer is n-doped.

Finally, an electrically conductive transparent layer and a protective layer are applied to the second layer in step g). The electrically conductive transparent layer can be, for example, a layer of indium-tin oxide or aluminum-zinc oxide. Furthermore, it preferably has conductor tracks for establishing electrical contacts on the photovoltaic cell of the invention. The protective layer is preferably an $SiO_x$ layer in which x=1 to 2.

EXAMPLE 1

5.16 g of Zn, 1.01 g of Mn and 12.76 g of Te, all elements having a purity of greater than 99.995%, were weighed into a fused silica tube having a diameter of 10 mm and a length of 200 mm. The fused silica tube was evacuated and flame-sealed under reduced pressure. It was then brought to 1250° C. over a period of 20 hours in a tube furnace while tilting about the longitudinal axis (period: about 90 s), maintained at this temperature for 5 hours and the furnace was then allowed to cool. A piece of fused material which had the composition $Zn_{0.8}Mn_{0.2}Te$ and a band gap at 2.28 eV in the optical reflection spectrum was obtained.

To dope this material with halogen ions and nitrogen ions, 1.8 g of the material and 16 mg of ammonium chloride were weighed into another fused silica tube. The fused silica tube was flame-sealed under reduced pressure. It was heated at 900° C. for 5 hours in a horizontal tube furnace. The furnace was then switched off. The sample obtained in this way contained 0.45 atom % of N and 2.0 atom % of $Cl^-$. It displays an additional absorption at 1.380 nm, which corresponds to an energy of 0.9 eV as intermediate level.

EXAMPLE 2

To effect electrochemical deposition, electrolyses were carried out in a 500 ml glass flange vessel provided with double wall, internal thermometer and bottom outlet valve. A stainless steel sheet (100×70×0.5) was used as cathode. The anode comprised MKUSF04 (graphite).

a) Preparation of ZnTe 21.35 g of ZnSO$_4$.7H$_2$O and 55.4 mg of Na$_2$TeO$_3$ were dissolved in distilled water. This solution was brought to a pH of 2 by means of H$_2$SO$_4$ (2 mol/l) and subsequently made up to 500 ml with distilled water (Zn=0.15 mol/l; Te=0.5 mmol/l; Zn/Te=300/1). The electrolyte solution was subsequently placed in the electrolysis cell and heated to 80° C. The electrolysis was carried out over a period of 30 minutes at a current of 100.0 mA without stirring. Deposition was effected at a cathode area of ~50 cm$^2$ (2 mA/cm$^2$). After the electrolysis was complete, the cathode was taken out, rinsed with distilled water and dried. A copper-colored film had been deposited (18.6 mg).

b) Preparation of Zn$_{1-x}$Mn$_x$Te 21.55 g of ZnSO$_4$.7H$_2$O (0.15 mol/l), 47.68 g of MnSO$_4$.H$_2$O (0.6 mol/l), 33 g of (NH$_4$)$_2$SO$_4$ (0.5 mol/l), 1 g of tartaric acid and 55.4 mg of Na$_2$TeO$_3$ (0.5 mmol/l) were dissolved in distilled water. This solution was brought to a pH of 2 by means of H$_2$SO$_4$ (2 mol/l) and made up to 500 ml with distilled water (Zn/Mn/Te=300/1200/1). The electrolysis solution was subsequently placed in the electrolysis cell and heated to 80° C. The electrolysis was carried out over a period of 60 minutes at a current of 101.3 mA without stirring. Deposition was effected at a cathode area of ~50 cm$^2$ (~2 mA/cm$^2$). After the electrolysis was complete, the cathode was taken out, rinsed with distilled water and dried. The weight gain was 26.9 mg. The deposit had a deep dark brown color.

The invention claimed is:

1. A photovoltaic cell comprising at least one photovoltaically active semiconductor material, wherein the at least one photovoltaicalty active semiconductor material is a p- or n-doped semiconductor material comprising a binary compound of the formula (I) or a ternary compound of the formula (II):

ZnTe     (I)

Zn$_{1-x}$Mn$_x$Te     (II)

wherein x is from 0.01 to 0.99, and wherein in the case that the photovoltaically active semiconductor material is n-doped, the n-doped semiconductor material present in the n layer has a composition corresponding to the formula (III) or (IV):

ZnTe$_{1-2y}$Hal$_y$N$_y$     (III)

Zn$_{1-x}$Mn$_x$Te$_{1-2y}$Hal$_y$N$_y$     (IV)

where x=0.01 to 0.99, y=0.01 to 0.2 and in the case that the photovoltaically active semiconductor material is p-doped, the p-doped semiconductor material present in the p layer has a composition corresponding to the formula (V) or (VI):

ZnTe$_{1-2y}$Hal$_y$N$_y$     (V)

Zn$_{1-x}$Mn$_x$Te$_{1-2y}$Hal$_y$N$_y$     (VI)

where x=0.01 to 0.99, y=0.01 to 0.2, and

"Hal" in both cases corresponds to a halogen ion, and the halogen ions are selected from the group consisting of fluoride, chloride, bromide and mixtures thereof, and an energy gap of the at least one photovoltaically active semiconductor material comprises an intermediate energy gap level.

2. The photovoltaic cell according to claim 1, wherein an atomic concentration of each of nitrogen and halogen ions is from 0.1 atom % to 20 atom % in the at least one photovoltaically active semiconductor material.

3. The photovoltaic cell according to claim 1, wherein
the p-doped semiconductor material contains at least one element from the group consisting of As and P at an atomic concentration of up to 0.5 atom %, and
the n-doped semiconductor material contains at least one element from the group consisting of Al, In and Ga at an atomic concentration of up to 0.5 atom %.

4. The photovoltaic cell according to claim 1, comprising:
an electrically conductive substrate,
a p layer of the p-doped semiconductor material having a thickness of from 0.1 to 10 μm and
an n layer of the n-doped semiconductor material having a thickness of from 0.1 to 10 μm.

5. The photovoltaic cell according to claim 4, wherein the substrate is a flexible metal foil or a flexible metal sheet.

6. The photovoltaic cell according to claim 4, wherein the n-doped semiconductor material
is doped with phosphorus, arsenic or a mixture thereof and
the p-doped semiconductor material
is doped with aluminum, indium, gallium or a mixture thereof.

7. A process for producing the photovoltaic cell according to claim 1, comprising:
coating an electrically conductive substrate with at least a layer of a p- or n-doped semiconductor material comprising the compound of the formula (1) or (II), having a thickness of from 0.1 to 10 μm;
wherein in the case that the photovoltaically active semiconductor material is n-doped, the coated n-doped semiconductor material has a composition corresponding to the formula (III) or (IV):

ZnTe$_{1-2y}$Hal$_y$N$_y$     (III)

Zn$_{1-x}$Mn$_x$Te$_{1-2y}$Hal$_y$N$_y$     (IV)

wherein x=0.01 to 0.99, y=0.01 to 0.2 and
in the case that the photovoltaically active semiconductor material is p-doped, the coated p-doped semiconductor has a composition corresponding to the formula (V) or (VI):

ZnTe$_{1-2y}$Hal$_y$N$_y$     (V)

Zn$_{1-x}$Mn$_x$Te$_{1-2y}$Hal$_y$N$_y$     (VI)

wherein x=0.01 to 0.99, y=0.01 to 0.2, and
"Hal" in both cases corresponds to a halogen ion, and the halogen ions are selected from the group consisting of fluoride, chloride, bromide and mixtures thereof.

8. The process according to claim 7, wherein the coating process comprises at least one deposition process selected from the group consisting of sputtering, electrochemical deposition and electroless deposition.

9. The process according to claim 8, wherein the coating process is sputtering and the process further comprises:
i) producing sputtering targets of Zn$_{1-x}$Mn$_x$Te:Al and Zn$_{1-x}$Te:P by melting the constituents together or
ii) sputtering the individual constituents of the semiconductor material successively onto the substrate and subsequently heating to a temperature of from 400 to 900° C.

10. The process according to claim 8, wherein the coating process is electroless deposition, and the process further comprises:

effecting deposition by crosslinking an aqueous solution comprising $Zn^{2+}$, $Mn^{2+}$ and $TeO_3^{2+}$ ions by reduction with hyperphosphorous acid ($H_3PO_2$) at a temperature of from 30 to 90° C. in the presence of the substrate.

11. A process to prepare the photovoltaic cell according to claim 1, wherein the photovoltaic cell comprises a p- or n-doped first layer and a p- or n-doped second layer, comprising:

coating an electrically conductive substrate with a first layer of $Zn_{1-x}Mn_xTe$ or ZnTe;

doping of the first layer with halogen ions and nitrogen ions;

further doping with donor atoms or acceptor atoms to obtain p- or n-doped first layer;

coating of the first layer with a second layer of $Zn_{1-x}Mn_xTe$ or ZnTe;

doping of the second layer with halogen ions and nitrogen ions;

further doping with acceptor atoms or donor atoms to obtain p- or n-doped second layer; and applying an electrically conductive transparent layer and a protective layer to the doped second layer.

12. The process according to claim 11, wherein the doping with halogen ions and nitrogen ions, comprises:

treating the layer of $Zn_{1-x}Mn_xTe$ or ZnTe with an ammonium halide at a temperature of from 500 to 1200° C. under nitrogen or argon to effect doping of the first and second layers with halogen ions and nitrogen ions.

* * * * *